United States Patent [19]

Le Nohaic

[11] Patent Number: 4,947,144
[45] Date of Patent: Aug. 7, 1990

[54] DISTRIBUTION DEVICE FOR DISTRIBUTING VERY HIGH DATA RATE DIGITAL SIGNALS

[75] Inventor: Yves Le Nohaic, Plouaret, France

[73] Assignee: Alcatel N.V., Amsterdam, Netherlands

[21] Appl. No.: 347,449

[22] Filed: May 4, 1989

[30] Foreign Application Priority Data

May 4, 1988 [FR] France .................. 88 05993

[51] Int. Cl.$^5$ ............................................. H01P 5/12
[52] U.S. Cl. ..................... 333/128; 333/127; 375/36
[58] Field of Search ............... 333/100, 124, 125, 127, 333/128, 136; 375/36

[56] References Cited

U.S. PATENT DOCUMENTS 3,593,174  7/1971  White .......................... 330/286
4,092,616  5/1978  Osterwalder ................ 333/125

FOREIGN PATENT DOCUMENTS 0196098  10/1986  European Pat. Off.
2173077  10/1986  United Kingdom ......... 333/124

OTHER PUBLICATIONS

"Slot Array Employing Photoetched Tri-Plate Transmission Lines", D. J. Sommers, IRE Transactions on Microwave Theory and Techniques, MIT, 1955.
"Monolitic GaAs travelling-wave divider/combiner", Electronic Letters, vol. 21, nr. 21, Oct. 10, 1985, pp. 950–951.
"Microwave Printed Circuits", Journal I.E.E., vol. 4, nr. 37, Jan. 1958, pp. 22–24, J. M. C. Dukes.

Primary Examiner—Paul Gensler
Attorney, Agent, or Firm—Christie, Parker & Hale

[57] ABSTRACT

The device of the invention comprises a bus (B) constituted by a series of lengths each of constant width and each of arbitrary length. The widths of the different lengths vary along the bus from one length to another, with the length connected to an emitter (E) being the widest. Each junction between two lengths is connected by a branch line (L2 to Ln) to an electronic circuit (D2 to Dn). The lines are of arbitrary lengths and have the same characteristic impedance. The end length (B1) of the bus is connected to an electronic circuit (D1). The end length and the branch lines are all terminated on their characteristic impedance. When signals are distributed symmetrically, distribution takes place from a differential emitter via two identical buses which are connected via differential lines to the electronic circuits.

17 Claims, 5 Drawing Sheets

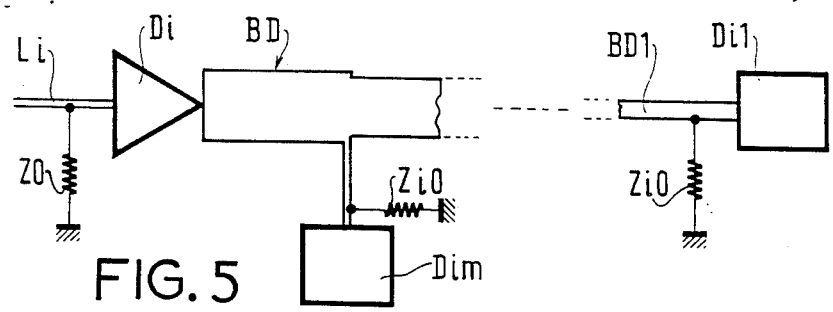
FIG. 5
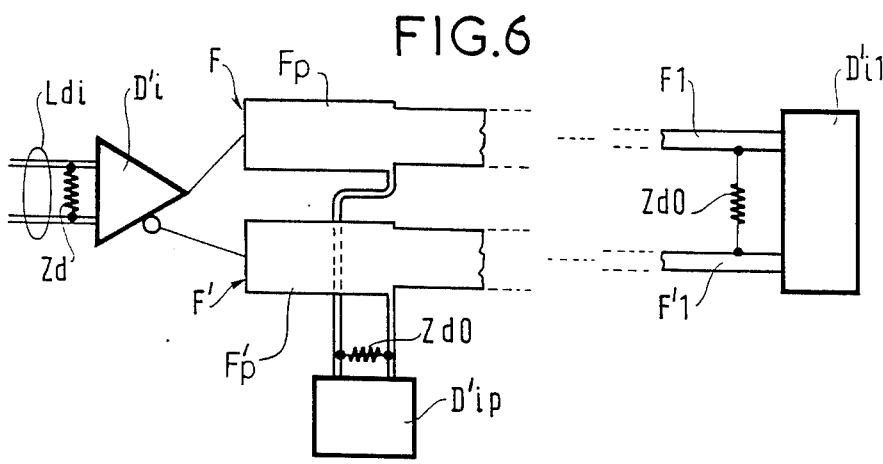
FIG. 6
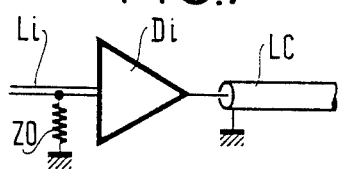
FIG. 7
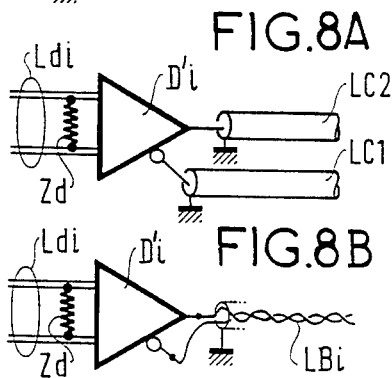
FIG. 8A
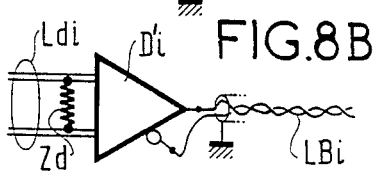
FIG. 8B
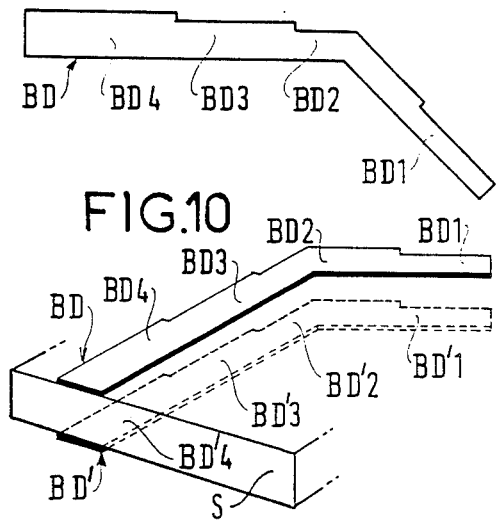
FIG. 9
FIG. 10

DISTRIBUTION DEVICE FOR DISTRIBUTING VERY HIGH DATA RATE DIGITAL SIGNALS

The invention relates to very high data rate digital signal transmission, and in particular it relates to distributing such signals via lines branching from a distribution line.

BACKGROUND OF THE INVENTION

At present, the data rates of digital signal transmissions may reach values such that spectrum components thereof reach the microwave range.

In order to conserve the waveform of the transmitted signals, it is essential to use perfectly matched transmission media since the slightest non-matched connection can be catastrophic from the transmission point of view.

At very high data rates, e.g. about 100 Mbit/s and above, the maximum length that can be tolerated for a branch line connected to a bus is very short, and a function of the data rate; the higher the data rate, the shorter the maximum length. For example, at a data rate of 100 Mbit/s, each branch line on a bus cannot be more than a few centimeters long since even when terminated with its characteristic impedance, it nevertheless gives rise to a degree of mismatch on the bus. If longer than 5 centimeters, a branch line gives rise to a non-acceptable degree of disturbance to the digital signals it transmits.

In the very common situation of distributing very high data rate digital signals to electronic devices mounted on a common printed circuit card, this limited line length imposes severe constraints on the locations that the electronic devices may occupy on the card, and these constraints may limit the number of electronic devices that can be placed on the card to one or two, even though there is room on the card for more devices.

The object of the invention is to make it possible to distribute very high data rate digital signals without disturbance via lines branching from a bus.

Another object of the invention is to avoid constraints on the location of electronic devices on a given printed circuit card, which constraints are due to the very short lengths of branch lines.

SUMMARY OF THE INVENTION

The present invention provides a distribution device for distributing very high data rate digital signals, the device comprising a distribution line connected at one end to a transmitter, and branch lines having the same characteristic impedance each connected to a respective electronic circuit, the distribution line being constituted by at least one bus of varying impedance, the bus being constituted by n lengths of different impedances, each length being constant in width, the width of successive lengths reducing from a widest end of the bus connected to the transmitter, each change in width between two successive lengths constituting a junction, and each branch line being connected to a junction, wherein the branch lines are of arbitrary lengths and the lengths of the bus are also arbitrary.

BRIEF DESCRIPTION OF THE DRAWINGS

Embodiments of the invention are described by way of example with reference to the accompanying drawings, in which:

FIG. 5 shows a variant of the electronic circuit of FIGS. 1 and 2;

FIG. 6 shows a variant of the electronic circuit of FIGS. 3 and 4;

FIG. 7 shows another variant of the electronic circuit of FIGS. 1 and 2;

FIGS. 8A and 8B show two other variants of the electronic circuit of FIGS. 3 and 4;

FIG. 9 shows a variant of the FIG. 2 bus;

FIG. 10 is a perspective view of a variant of two FIG. 4 buses;

DETAILED DESCRIPTION

Figure 1:
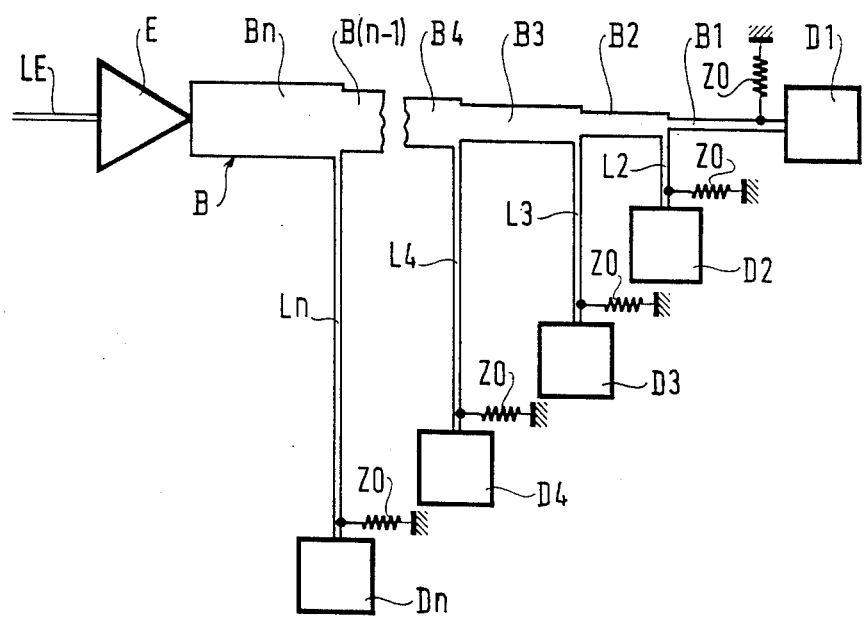
FIG. 1 shows a distribution device of the invention for asymmetrical distribution.

FIG. 1 shows a distribution device of the invention for asymmetrical distribution. In this figure, the distribution line is a bus B of varying impedance connected to lines L2, L3, ..., Ln of arbitrary lengths, each of said lines having the same characteristic impedance Z0.

The bus B is made up of lengths B1, B2, ..., Bn, with the lengths Bn being connected to a transmitter E which is in turn connected to an input LE (differential or otherwise), with the length B1 being connected to an electronic circuit D1. Each length is constant in width and of arbitrary length. The widths of the lengths increase from one length to the next, with the length B1 being the narrowest. Each junction between two lengths is obtained by a symmetrical change in width of the length about its long direction, said variation taking place on both sides of each length.

The transmitter E is of conventional type and serves to shape the digital signals which it receives via the input line LE. The bus B is a conductor, e.g. a printed circuit track, and the lengths B1 to Bn have respective impedances Z1 to Zn. At each junction between two lengths, one of the lines L2, ..., Ln connects the bus to an electronic circuit D2, D3, ..., Dn. At the input to each of the electronic circuits D2 to Dn, the lines are terminated on their characteristic impedance Z0. The end of the last length B1 is applied to the input of electronic circuit D1 which is terminated by an impedance Z1 which is preferably equal to Z0.

In order to obtain good digital signal transmission, the lengths are terminated on their own impedances; and the impedances of the lengths are then as follows:

$$Z2 = Z0 \cdot Z1/[Z0+Z1]$$

$$Z3 = Z0 \cdot Z2/[Z0+Z2]$$

$$Zn = Z0 \cdot Z(n-1)/[Z0+Z(n-1)]$$

where Z1=Z0 if the length B1 has impedance Z0.

Putting Z0=100 ohms, then Z1=100 ohms, Z2=50 ohms, Z3=33.3 ohms, and Z4=25 ohms. Using electronic circuits D1, D2, ..., Dn implemented in ECL logic, it is possible to distribute to four electronic circuits since the value 25 ohms is the lower limit specified by circuit manufacturers as an output load on an electronic circuit.

Figure 2A:
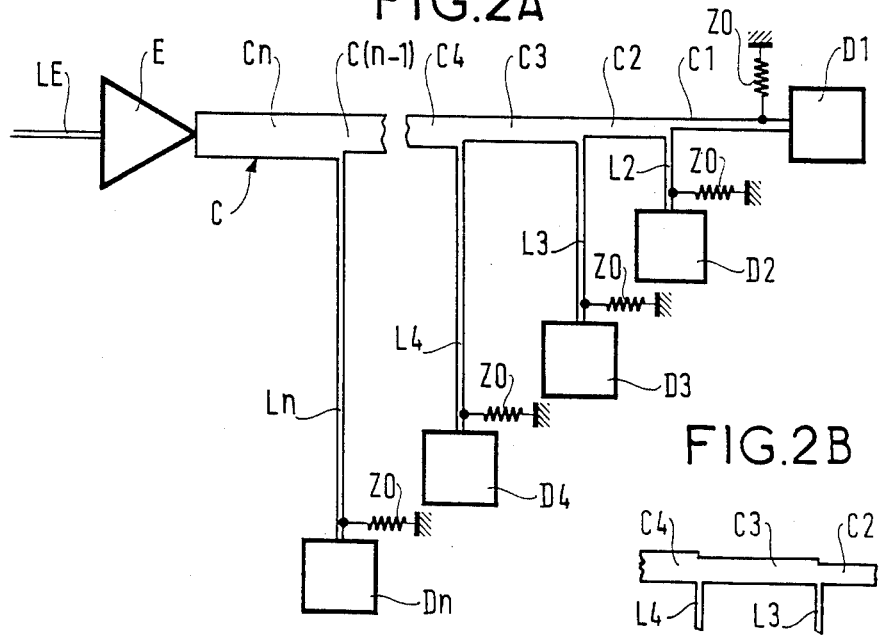
FIG. 2A shows a variant of the FIG. 1 distribution device.

FIG. 2A shows a variant of the FIG. 1 distribution device. In this figure, one of the longitudinal sides of the bus C is rectilinear and the change in width between successive lengths takes place solely on the other longitudinal side of the bus. As in FIG. 1, the lines L2, L3, ..., Ln are connected to the bus where the lengths join one another and they are terminated on their characteristic impedance Z0. The end length C1 at the end of the bus furthest from the transmitter E which is connected to length Cn is itself connected to an electronic circuit D1, with said length C1 being terminated on an impedance Z0 as in FIG. 1, assuming that the impedance Z1 of the length C1 is equal to Z0. The values for the impedances Z2 to Zn of lengths C2 to Cn are given by the above-specified equations.

Figure 2B:
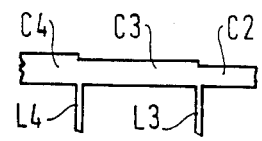
FIG. 2B shows a variant of the FIG. 2A bus.

FIG. 2B shows a variant way of connecting the lines L2 to Ln to the bus C of FIG. 2A. In FIG. 2B, the lines are connected to the rectilinear side of the distribution bus level with the steps which constitute the junctions between the various lengths of the distribution bus.

Figure 3:
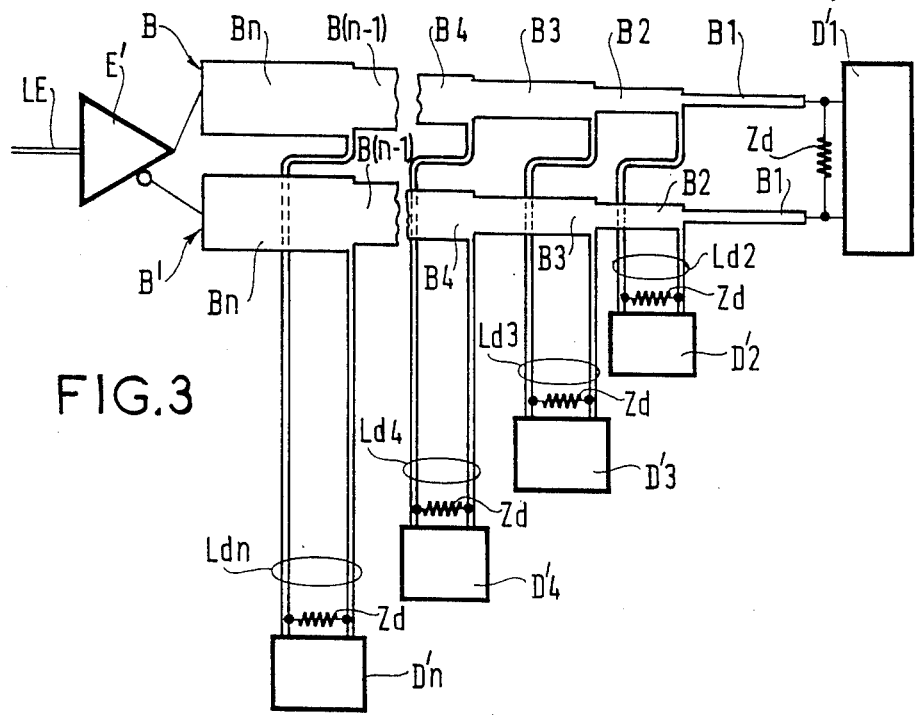
FIG. 3 shows a distribution device of the invention for symmetrical distribution.
Figure 4:
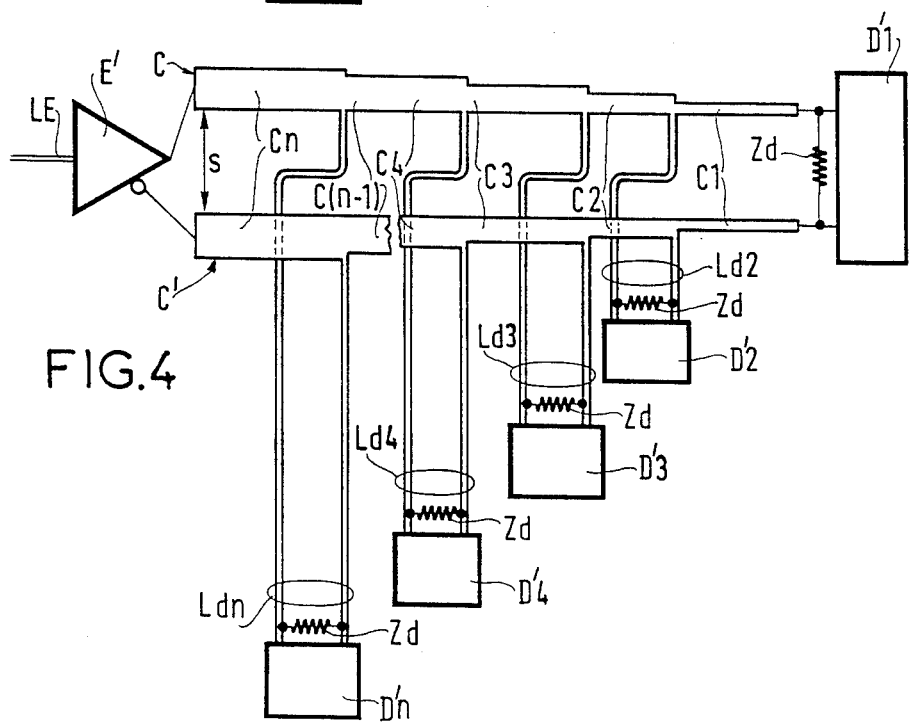
FIG. 4 shows a variant of the FIG. 3 distribution device.

FIGS. 3 and 4 show a distribution device of the invention for symmetrical distribution. In these figures, the distribution line is a differential line constituted by two identical buses B and B', each transmitter having one end connected to the output of a differential E' whose input is connected to an input line LE, which may be differential or otherwise.

In FIG. 3, the two buses B and B' are as the same type as distribution bus of FIG. 1, i.e. there is a step in each side of the distribution bus at each junction between two successive lengths. In FIG. 4, both distribution buses C and C' are of the same type as the FIG. 2 distribution bus, i.e. each bus includes a rectilinear side and each junction between two successive lengths of the bus is constituted by a step in the other longitudinal side of the bus. In FIG. 4, the rectilinear longitudinal sides of the distribution buses C and C' face each other and are at a constant distance apart s equal to a few tenths of a millimeter.

Each of the electronic circuits $D'_2, D'_3, \ldots, D'_n$, is connected to a corresponding pair of junctions in the two distribution buses B and B' or C and C' via respective differential lines $Ld_2, Ld_3, \ldots, Ld_n$. The differential lines $Ld_2$ to $Ld_n$ are of arbitrary lengths, and of the same impedance. Each of them is therefore terminated, at its end adjacent to the inlet to an electronic circuit, on an impedance Zd equal to its characteristic impedance.

In these two figures, the pair of end lengths B1 or C1 in the two distribution buses is connected to an electronic circuit D'1, and is terminated on an impedance equal to the impedance of the pair of end lengths, which impedance is preferably equal to the characteristic impedance Zd of the differential lines.

Using the notation $Z1d, Z2d, \ldots, Znd$, for the impedances of respective pairs of corresponding lengths B1, B2, ..., Bn in FIG. 3, or C1, C2, ..., Cn, in FIG. 4, then:

$$Z2d = Zd \cdot Z1d / [Zd + Z1d]$$

$$Z3d = Zd \cdot Z2d / [Zd + Z2d]$$

$$Znd = Zd \cdot Z(n-1)d / [Z1 + Z(n-1)d]$$

where $Z1d = Zd$ if the terminal pair of lengths B1 or C1 has an impedance equal to Zd.

In FIGS. 1 to 4, digital signals are distributed to electronic circuits D1 to Dn or D'1 to D'n. These electronic circuits are either circuits for making use of the received signals, or else they are transmission circuits each including a corresponding transmitter E or E' having its output connected to a distribution bus or to a coaxial line or to a shielded pair, for example, and naturally in FIGS. 1 to 4, some of the devices could be end use circuits and others could be transmission circuits. When all the electronic circuits are transmission circuits, then the card may be a mother board for distributing the digital signals it receives to said transmission circuits, as described below with reference to FIGS. 11 and 12.

In FIG. 5, references Li and Di designate a line and an electronic circuit of FIGS. 1 and 2. In this case, the electronic circuit is a transmitter having its output connected to a distribution bus BD having m lengths connected to electronic circuits Di1 to Dim, with the length BD1 being terminated on an impedance Zi0 equal to the characteristic impedance of said length. The electronic circuits such as Dim are connected by lines to the bus BD, said lines being of arbitrary length and having the same characteristic impedance, e.g. of value Zi0. All of them are terminated on their characteristic impedance.

In FIG. 6, Ldi and D'i designate a differential line and an electronic circuit as shown in FIGS. 3 and 4. This electronic circuit is a differential transmitter having its output connected to two distribution buses F and F' each having p lengths, referenced F1 to Fp and F'1 to F'p, which lengths are connected to electronic circuits D'i1 to D'ip, with the electronic circuit D'i1 being connected to the ends of the lengths F1 and F'1 of the two buses F and F', and with the other electronic circuits such as D'ip being connected via respective differential lines to corresponding lengths of the two buses F and F'. The differential lines are of arbitrary length and have the same impedance and they are terminated on impedances Zd0 equal to their characteristic impedance. The ends of the lengths F1 and F'1 are connected via an impedance Zd0, assuming that the line constituted by the pair of lengths F1 and F'1 has an impedance of Zd0.

In FIG. 7, the references Li and Di designate a line and an electronic circuit as shown in FIG. 1. In this case, the electronic circuit is a transmitter connected to a coaxial cable LC.

In FIGS. 8A and 8B, Ldi and D'i designate a differential line and an electronic circuit as shown in FIGS. 3 and 4. In this case, the electronic circuit is a differential transmitter having its output connected to two coaxial cables LC1 and LC2, (FIG. 8A) or to a screened twisted pair LBi (FIG. 8B).

In FIGS. 5 and 7 the transmitter could be a differential transmitter, in which case it should be connected in FIG. 5 to two identical buses, and in FIG. 7 to two coaxial cables or to a screened twisted pair. Similarly, in FIGS. 6 and 8A, 8B, the transmitter could be a transmitter connected to a single bus or to a single coaxial cable, in order to provide asymmetrical distribution. As is well known, a single bus for asymmetrical distribution is typically associated with a ground plane separated from the bus by a dielectric (not shown).

The bus for asymmetrical distribution or the two buses for differential distribution need not be rectilinear and could be bent through an arbitrary angle in order to make good use of the printed circuit card area when locating the electronic circuits. FIG. 9 shows a bus BD for asymmetrical distribution having a bend in its second length BD2.

FIG. 10 shows two buses BD and BD' for differential distribution, with both of the uses being bent in its second length BD2 or BD'2 respectively. For differential distribution, both buses are preferably superposed, although naturally they must be insulated from each other, e.g. by means of a substrate S, thereby enabling the two wires of each differential line to have the same length and also enabling corresponding lengths of the bus to run parallel so that the impedances of each pair of corresponding lengths are well defined.

Figure 11:
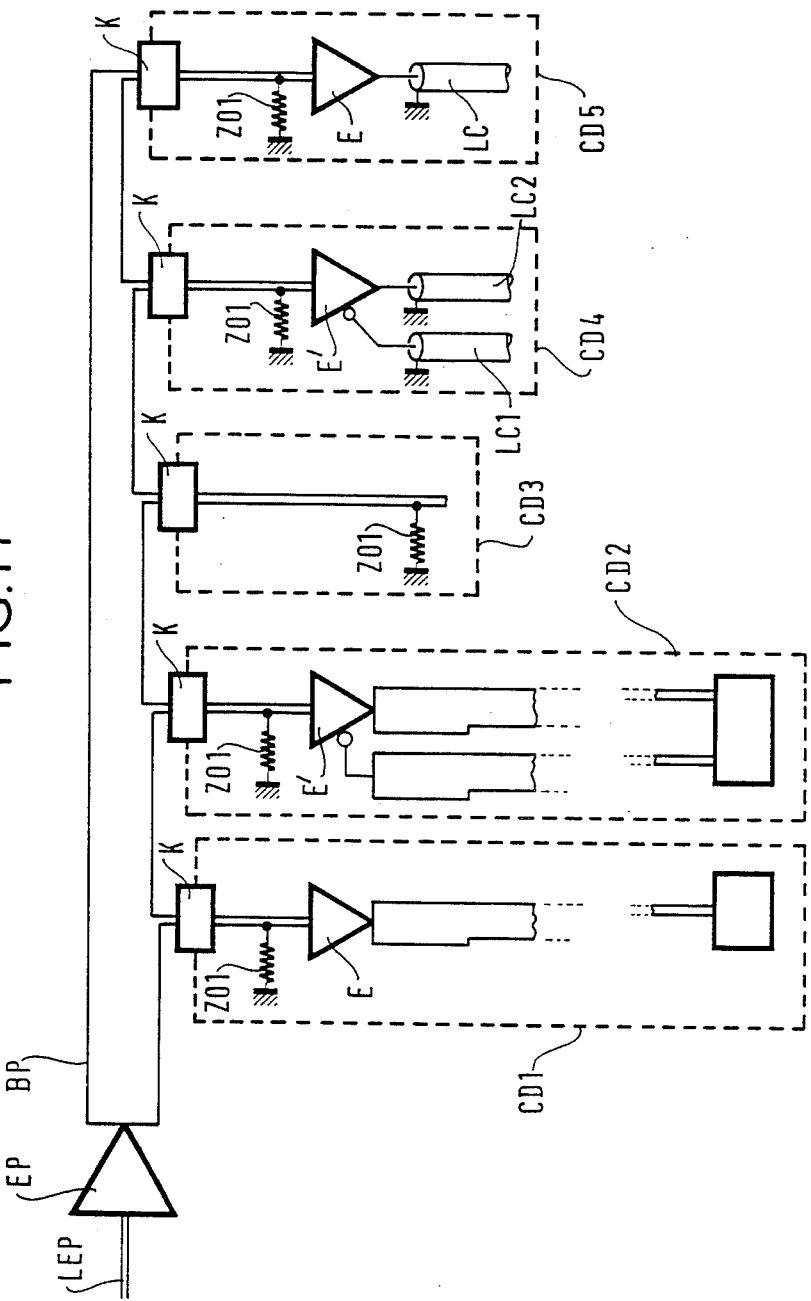
FIG. 11 shows an asymmetrical distribution device of the invention used as a mother board.
Figure 12:
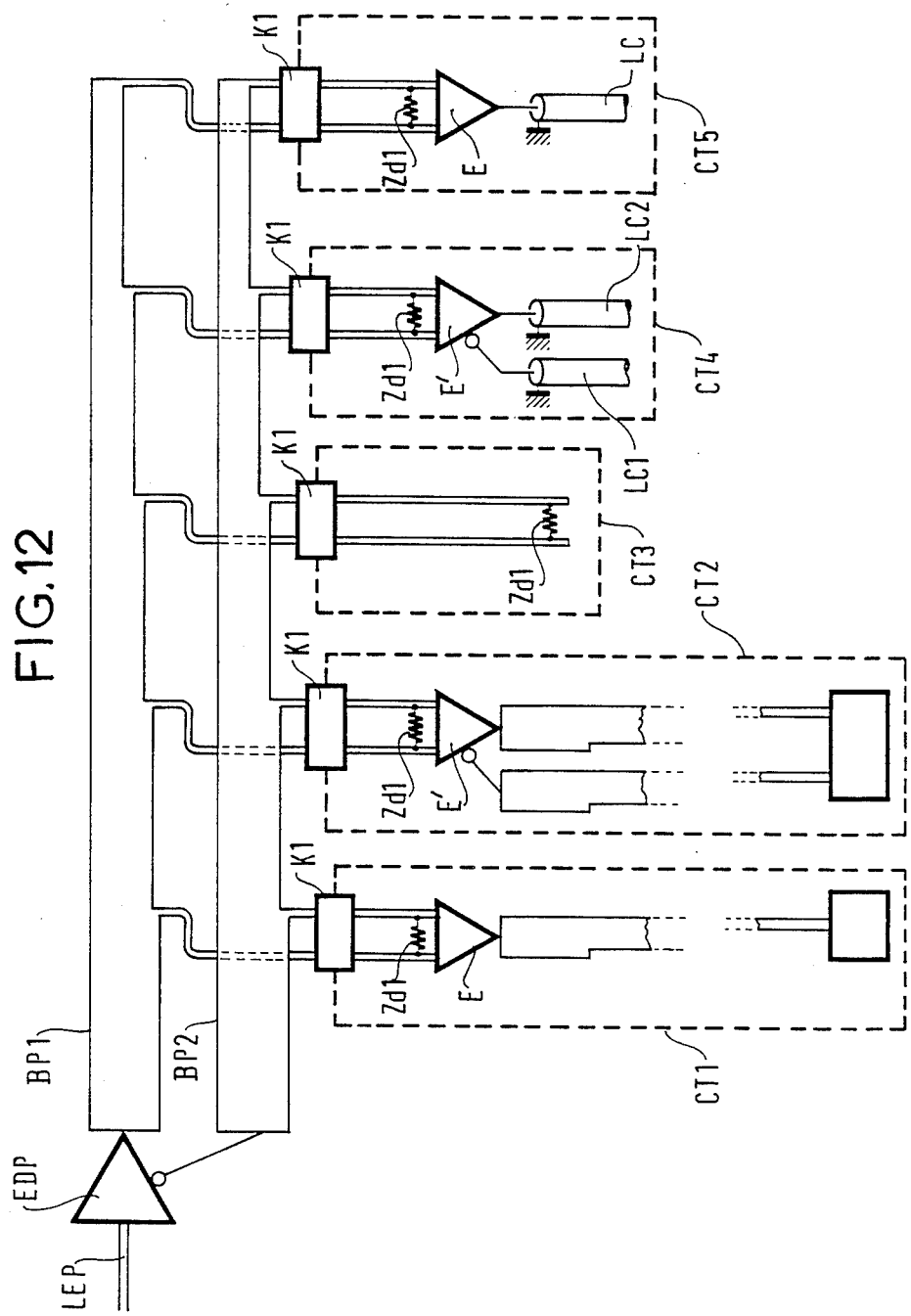
FIG. 12 shows a symmetrical distribution device of the invention used as a mother board.

FIGS. 11 and 12 relate to mother board distribution, with FIG. 11 relating to asymmetrical distribution and FIG. 12 relating to symmetrical distribution.

In FIG. 11, a mother board includes a transmitter EP and a distribution bus BP connected to the output of the transmitter, which in turn has its input connected to a line LEP, which may be differential or otherwise. In this figure, a bus is shown having a rectilinear side like the bus C in FIG. 2, however it should naturally be understood that the bus BP could have junctions obtained by symmetrical changes in the widths of the lengths as shown in FIG. 1. Each junction is connected by means of a connector K to transmission circuits CD1, CD2, CD4, and CD5. Transmission circuit CD1 is of the type shown in FIGS. 1 and 2. Transmission circuit CD2 is of the type shown in FIGS. 3 and 4. Transmission circuit CD4 is constituted by a differential transmitter E' having its output connected to two coaxial cables LC1 and LC2 which could be replaced by a screened twisted pair line. Transmission circuit CD5 is of the type shown in FIG. 5 and is connected by a connector K to the end length of the bus BP. In transmission circuits CD1, CD2, CD4, and CD5, the transmitters are connected to the distribution bus BP by branch lines of arbitrary length and common characteristic impedance Z01. The circuit CD3 is a plug circuit likewise connected by a connector K to a junction in the bus BP, and constituted solely by a line terminated on its characteristic impedance Z01, which is the same as the impedance of the other lines of the transmission circuits. This plug circuit serves to conserve the impedance of the bus BP and the corresponding junction, either because the transmission circuit that would normally be connected to said junction is out of order, or else because there is no intention of connecting said junction to a transmission circuit.

In FIG. 12, the mother board comprises a differential transmitter EDP and two distribution buses BP1 and BP2 each having a rectilinear side as shown in FIG. 4, but naturally, they could be of the same type as the buses B and B' as shown in FIG. 3. Each pair of junctions in the buses BD1 and BD2 is connected via a connector K1 to transmission circuits. By way of example, various different transmission circuits CT1, CT2, CT4, and CT5 are shown. Transmission circuit CT1 is of the same type as shown in FIGS. 1 and 2 with an input line LE which is a differential line. Transmission circuit CT2 is of the type shown in FIGS. 3 and 4 and its input circuit LE is a differential line. Transmission circuit CT4 is of the type shown in FIG. 8A, and the two coaxial cables could be replaced by a screened twisted pair line as shown in FIG. 8B. Transmission circuit CT5 is of the type shown in FIG. 7 and is connected by a connector K1 to the two end lengths of the buses BP1 and BP2. In transmission circuits CT1, CT2, CT4, and CT5, the transmitters are connected to two distribution buses BP1 and BP2 via differential lines of arbitrary length and common characteristic impedance Zd1. The circuit CT3 is a plug circuit, likewise connected by a connector K1 to the two buses BP1 and BP2, and including a differential line terminated on its characteristic impedance Zd1 which is equal to the impedance of the differential lines of the transmission circuits. This plug circuit performs the same function as the plug circuit CD3 in FIG. 11.

In FIGS. 11 and 12, the transmission circuits and the plug circuits are carried by printed circuit cards. The various circuits shown are given purely by way of example and naturally all of the transmission circuits could be identical and of any desired type. Similarly, the transmission circuits may be of one or several of the types shown, and the plug circuits could be omitted, so long as none of the transmission circuits is out of order.

I claim:

1. A distribution device for distributing very high data rate digital signals to a plurality of digital signal processing circuits, the device comprising:

a digital transmitter;

a distribution bus having a varying impedance and defining a plurality of adjacent bus lengths of different impedances, each said length being constant in width and having an arbitrary length, each successive said bus length having a reduced width compared to the immediately preceding bus length, the widest bus length being connected to the digital transmitter, each change in width between two successive said bus lengths defining a respective junction, and a plurality of branch lines each having an arbitrary length and coupling a respective said junction with a respective said digital signal processing circuit, at least one said branch line having a length different from the length of a second said branch line.

2. A distribution device according to claim 1, wherein:

the distribution bus forms a mother board;

each branch line and the associated electronic circuit constitutes a printed circuit card, with each branch line being connected to a junction of the bus via a connector; and the end length of the bus is connected via a connector to an electronic circuit carried by a printed circuit card.

3. A distribution device according to claim 2, wherein a defective printed circuit card is replaced by a plug card including merely a line terminated by its characteristic impedance.

4. The distribution device of claim 1, wherein the impedance of each said bus length is given by the recursive formula $$z(n) = z(0) \cdot z(n-1)/[z(0) + z(n-1)]$$

where
   $z(0)$ is a common characteristic impedance of all said branch lines;
   $z(1)$ is the impedance of the end bus length; and
   $z(n)$ is the impedance of the bus length $n-1$ lengths from the end bus length.

5. The distribution device of claim 4, wherein $z(0) = z(1)$.

6. The distribution device of claim 1, wherein an end bus length most remote from the transmitter is connected directly to an end one of the digital signal processing circuits.

7. A distribution device for distributing digital signals, the device comprising:
a differential transmitter;
two identical distribution buses mounted opposite each other for providing differential distribution, each said distribution bus having a varying impedance and defining a respective plurality of adjacent pairs of bus lengths with each said bus length pair having a different characteristic impedance, each of said bus lengths being constant in width, each successive said bus length having a reduced width compared to the immediately preceding bus length, the widest bus length of each said bus being connected to the differential transmitter, each change in width between two successive said bus length pairs defining a respective an intermediate junction pair, an end said bus length pair most remote from the differential transmitter having a predetermined characteristic impedance and defining an end junction pair; and
a plurality of differential branch line pairs, each said differential branch line pair having a characteristic impedance equal to said predetermined characteristic impedance, an end said branch line pair being connected to said end junction pair, a respective other said differential branch line pair being connected to each said intermediate junction pair.

8. A distribution device according to claim 7, wherein the lengths are connected to each other at each junction on both sides of the lengths.

9. A distribution device according to claim 7, wherein a bus has one longitudinal side which is rectilinear and that pairs of successive lengths are connected to each other on the other side of said lengths.

10. A distribution device according to claim 9, wherein:
the two distribution buses constitute a distribution line of a mother board;
each differential branch line and the associated electronic circuit constitutes a printed circuit card, with each differential line being connected to a pair of corresponding junctions of the buses via a connector; and
the end lengths of the buses are connected by a connector to an electronic circuit carried by a printed circuit card.

11. A distribution device according to claim 7, wherein both buses have one rectilinear longitudinal side, with pairs of successive lengths in each bus being connected to each other via the other side of said lengths, and that the rectilinear longitudinal sides of the two buses face each other.

12. A distribution device according to claim 7, wherein a bus is straight.

13. A distribution device according to claim 7, wherein the two buses are superposed and isolated from each other.

14. A distribution device according to claim 7, wherein the buses are bent lengthwise through an arbitrary angle, with the bends being situated in corresponding positions in both buses.

15. A distribution device according to claim 14, wherein the two buses are superposed and isolated from each other.

16. The distribution device of claim 7, wherein the impedance of each said bus length pair is given by the recursive formula $$z(n) = z(0) \cdot z(n-1) / [z(0) + z(n-1)]$$

where
z(0) is a common characteristic impedance of all said branch lines;
z(1) is the impedance of the end bus length pair; and
z(n) is the impedance of the bus length pair n−1 lengths from the end bus length pair.

17. The distribution device of claim 16, wherein z(0)=z(1).

* * * * *

UNITED STATES PATENT AND TRADEMARK OFFICE
CERTIFICATE OF CORRECTION

PATENT NO. : 4,947,144

DATED : August 7, 1990

INVENTOR(S) : Yves Le Nohaic

It is certified that error appears in the above-identified patent and that said Letters Patent is hereby corrected as shown below:

Column 3, line 26, after "each" and before "having" delete -- transmitter --.

Column 3, line 27, after "differential" insert -- transmitter --.

Column 7, line 18, after "respective" and before "intermediate" delete -- an --.

Signed and Sealed this

Fifth Day of May, 1992

*Attest:*

DOUGLAS B. COMER

*Attesting Officer*  *Acting Commissioner of Patents and Trademarks*